United States Patent [19]

Stevens

[11] Patent Number: 5,741,721

[45] Date of Patent: Apr. 21, 1998

[54] METHOD OF FORMING CAPACITORS AND INTERCONNECT LINES

[75] Inventor: E. Henry Stevens, Colorado Springs, Colo.

[73] Assignee: Quality Microcircuits Corporation, Colorado Springs, Colo.

[21] Appl. No.: 630,061

[22] Filed: Apr. 12, 1996

Related U.S. Application Data

[62] Division of Ser. No. 189,921, Feb. 1, 1994, Pat. No. 5,508,881.
[51] Int. Cl.⁶ ........................................ H01L 21/70
[52] U.S. Cl. ............................... 437/60; 437/52
[58] Field of Search ................... 437/47, 48, 52, 437/60, 919

[56] References Cited

U.S. PATENT DOCUMENTS

| | | | |
|---|---|---|---|
| 4,970,564 | 11/1990 | Kimura et al. | 357/23.6 |
| 5,231,044 | 7/1993 | Jun | 437/52 |
| 5,248,629 | 9/1993 | Muroyama | 437/52 |

Primary Examiner—John Niebling
Assistant Examiner—Joni Y. Chang
Attorney, Agent, or Firm—William E. Hein

[57] ABSTRACT

A multi-region material structure and process for forming capacitors and interconnect lines for use with integrated circuits provides (1) capacitor first or bottom electrodes comprising a transition-metal nitride; (2) a capacitor dielectric comprising a transition-metal oxide; (3) capacitor second or top electrodes comprising a transition-metal nitride, a metal or multiple conductive layers; (4) one or more levels of interconnect lines; (5) electrical insulation between adjacent regions as required by the application; and (6) bonding between two regions when such bonding is required to achieve strong region-to-region adhesion or to achieve a region-to-region interface that has a low density of electrical defects. The process for forming the material structures involves formation of the capacitor dielectric on the first electrode surfaces by conversion of a conductive transition-metal nitride to an insulating transition-metal oxide and formation of low-defect-density interfaces between capacitor second electrodes and the capacitor dielectric.

23 Claims, 4 Drawing Sheets

METHOD OF FORMING CAPACITORS AND INTERCONNECT LINES

REFERENCE TO RELATED APPLICATION

This is a division of application Ser. No. 08/189,921 filed Feb. 1, 1994, now issued as U.S. Pat. No. 5,508,881.

BACKGROUND AND SUMMARY OF THE INVENTION

This invention relates generally to interconnecting an ensemble of integrated circuit chips in order to produce an electronic device and more particularly to structures and processes that can be employed for interconnecting the ensemble of chips. The electronic device may be designed to perform functions such as acquisition, processing, storing, and transmission of information. The electronic device may also transfer information and energy to another device in order to produce a visible display of information or in order to produce a mechanical action. The structures are comprised of capacitors and interconnect lines that can be formed over a variety of substrates by means of multi-step processes that are compatible with volume manufacturing.

Integrated circuit chips that offer a high level of functional complexity and that operate at high speeds are commercially available. More than 16 million bits of information can be stored within a single DRAM chip. Microprocessors can operate at a cycle rate of 200 MHz. Complex logical operations can be performed by chips that typically have more than 100 input/output terminals.

Efficient utilization of the functional complexity available from an ensemble of integrated circuit chips requires providing interconnect lines having line widths on the order of 10 to 25 micrometers and having line-to-line spacings on the order of 50 micrometers. See P. Garrou, "Thin Film Interconnection Technology Boosts MCN Performance," Electronic Packaging and Production, pp. 44–48, October, 1992. Utilization of the operating speed available from high performance chips requires providing interconnect lines that are configured to have a controlled impedance. See A. S. Francomacaro, N. A. Blum, G. V. Clatterbaugh, and T. R. Sanderson, "Packaging Bare Chip Gallium Arsenide Devices Using Low K, Low Temperature Cofired Ceramic (LTCC) Substrates," Proceedings of the 1991 International Symposium on Microelectronics, pp. 392–396. Reliable operation of an ensemble of chips at cycle rates on the order of 200 MHz requires providing capacitors for distributed storage of energy. See F. Matta, B. Heflinger, R. Kaw, and V. Rastogi, "High-Performance Packaging at Competitive Cost Using Demountable TAB," Proceedings of the 1991 International Symposium on Microelectronics, pp. 324–327 and T. Sons, Y. Wen, and A. Agarwal, "Electrical Considerations for Multi-Chip Module Design," Proceedings of the 1991 International Symposium on Microelectronics, pp. 287–291. In summary, interconnect line patterns having narrow widths and spaces, interconnect lines having a controlled impedance, and energy storage capacitors all must be provided within an electronic device that utilizes complex and high performance integrated circuit chips.

The current usual practice is to provide chip capacitors for energy storage. The capacitors are typically formed from multiple alternating dielectric layers and conductive layers. The chip capacitors must be attached to the substrate as near as possible to the input/output terminals of high performance chips. In general, each high performance integrated circuit chip has one or more high speed outputs and, in general, an energy storage capacitor is required for each high speed output. Thus, the number of chip capacitors required may often be greater than the number of integrated circuit chips. Because the chip capacitors occupy considerable substrate area and because a small fraction of the chip capacitors fail to function properly after attachment to the substrate, having to provide large numbers of chip capacitors increases the manufacturing cost and reduces the operating reliability of complex electronic devices.

Recently, improved means have been devised for forming capacitors over the surface of ceramic substrates. See I. Burn and L. Drozdyk, "Reliability of Thick-Film Capacitors," Proceedings of the 1992 International Symposium on Microelectronics, pp. 439–444 and P. W. Bless, R. L. Wahlers, C. Y. D. Huang, and S. J. Stein, "New Capacitor Dielectrics Covering K=2,000 to 12,000 for Printing and Firing Applications Below 1000 Degrees C.," Proceedings of the 1992 International Symposium on Microelectronics, pp. 445–450. The capacitor dielectric is comprised principally of barium titanate or one of a family of lead-and-oxygen-containing compounds that also typically contain one or more of the following elements: zirconium, lanthanum, manganese, calcium, tungsten or iron. Members of this dielectric-materials family of lead-and-oxygen-containing compounds are often termed "relaxors" in the technical literature. Capacitor top and bottom electrodes are typically formed from ceramic-metal compositions (cermets) that contain silver, silver and platinum, silver and palladium, or gold. The capacitor electrodes and the capacitor dielectric are typically deposited by a screen printing process. In order to obtain a sufficiently low level of structural defects, two or more successive screen printings are typically employed to form the capacitor dielectric layer. The final compositions of the capacitor electrodes and the capacitor dielectric layer are formed during heat treatments (firings) at a temperature in the range of 800 degrees C. to 900 degrees C. Dielectric constants (relative permittivity) in the range of 2,000 to 12,000 have been achieved from dielectric layers having a thickness in the range of 30 to 50 micrometers. Because the capacitor dielectric and electrode layers are relatively thick by microelectronic standards, this means for forming capacitors over ceramic substrates is termed a thick film process in the technical literature.

The high permittivity values attainable with relaxor dielectric materials allow energy storage capacitors to be formed by thick film processes, but the relaxor materials and thick film processes have limitations. The permittivity of relaxor materials is quite temperature sensitive. Their properties degrade when exposed to water or reducing agents; thus, capacitors must be thoroughly protected by an overlying coating. Finally, the small line widths and spaces required for efficient interconnection of integrated circuit chips cannot be achieved using thick film processes.

It is known to form capacitors on integrated circuit chips. In one known process, described in U.S. Pat. No. 4,785,202 to Toyoda, a capacitor is formed from a silicon dioxide dielectric layer having a thickness of 300 nanometers sandwiched between aluminum plates. In another known process, capacitors are formed from a lead-containing dielectric material sandwiched between platinum electrodes. See R. E. Jones, Jr., P. D. Maniar, J. O. Olowolafe, A. C. Campbell, and C. J. Mogab, "Electrical Characteristics of Paraelectric Lead Lanthanum Zirconium Titanate Thin Films for Dynamic Random Access Memory Applications," Applied Physics Letters, Vol. 60, No. 8, pp. 1022–1024, Feb. 24, 1992.

The charge storage capacity provided in accordance with the teachings of U.S. Pat. No. 4,785,202 is sufficient to provide a low impedance bypass for on-chip circuit elements such as diodes, but the charge storage capacity is not sufficient to supply the distributed energy storage required within a high performance electronic device. When information and energy are transferred from one chip to another, the capacitance of the interconnect line between the chips must be either charged or discharged. The capacitance of the interconnect line typically may be in the range of 10–25 picofarads. If output of information is to be accomplished by rapid transfer of charge from an on-chip storage capacitor to an interconnect line, the storage capacitance must be on the order of ten times the capacitance of the interconnect line. Thus, a storage capacitance on the order of 250 picofarads is required. An on-chip storage capacitance of 250 picofarads formed in accordance with the teachings of U.S. Pat. No. 4,785,202 would occupy a prohibitively large area of about two square millimeters adjacent to each high speed output provided on the chip.

The process taught in the Jones et al. reference, supra, does allow providing distributed energy storage on high performance integrated circuit chips. Utilization of a capacitor dielectric comprised of a lead-lanthanum-zirconate-titanate compound allows providing 250 picofarads of capacitance within an area having dimensions of about 50 micrometers by 100 micrometers. A 50 micrometer by 100 micrometer area can be provided between adjacent input/output terminals on an integrated circuit chip without excessively increasing the overall chip area.

Although utilization of lead-lanthanum-zirconate-titanate compounds for the capacitor dielectric allows providing distributed energy storage on integrated circuit chips, adding such storage capacitors to chips constrains the chip manufacturing process. The constituent materials for the capacitor dielectric can be applied to a semiconductor wafer by spin coating the wafer with an appropriate solution, sputtering from a target having an appropriate composition, or chemical vapor deposition from an appropriate gas mixture. See Jones et al., supra, and J. Lee, V. Chikarmane, C. Sudhama, J. Kim, and A. Tasch, "Sputtered Ferroelectric Thin Films for Dynamic Random Access Memory Applications," Proceeding of the 4th International Symposium on Integrated Ferroelectrics, pp, 298–307, Mar. 9–11, 1992, and U.S. Pat. No. 5,104,690 to Greenwald. Regardless of the method employed to apply the dielectric material constituents to the wafer, the wafer with the overlying deposited dielectric material constituents must be annealed in an oxygen atmosphere at a temperature in the range of 550–800 degrees C. in order to establish the required material composition and the perovskite crystal structure. Because the aluminum alloys typically used for interconnect lines cannot be exposed to temperatures in the 550–800 degree C. range, the dielectric material forming anneal must be incorporated in the manufacturing process prior to forming aluminum alloy interconnect lines. After its formation, the capacitor dielectric cannot be exposed to hydrogen or other reducing agents. Therefore, the damage removal anneal in a hydrogen-nitrogen atmosphere that is almost always incorporated at or near the end of integrated circuit manufacturing processes must be eliminated. Furthermore, a protective coating that is effective in preventing water from reaching the capacitor dielectric must be deposited over the surface of the integrated circuit by a deposition process that minimizes hydrogen incorporation within the protective coating.

Providing platinum electrodes for on-chip capacitors considerably complicates the chip manufacturing process. Titanium is typically deposited before depositing platinum to provide a bonding layer between capacitor bottom electrodes and the underlying material. Because titanium can diffuse through the platinum bottom electrode and thereby degrade properties of the capacitor dielectric, titanium and platinum layer thicknesses and the anneals performed subsequent to deposition of the capacitor electrode structure must all be precisely controlled. Because adhesion between a platinum bottom electrode and the overlying dielectric layer is poor, means for improving the adhesion by oxidation of the platinum surface may have to be incorporated in the manufacturing process, as described in U.S. Pat. No. 5,164,808 to Evans et al. Because platinum is not chemically reactive, etching of small-geometry platinum features such as capacitor top electrodes must be accomplished by ion milling, which is both damaging and difficult to control. Finally, reliable connections between platinum and aluminum cannot be formed because aluminum and platinum intermix; thus, a metallurgic barrier such as titanium nitride must be incorporated within the interconnect material structure, as described in U.S. Pat. No. 4,977,440 to Stevens.

Providing a capacitor dielectric material comprised of a lead-containing compound considerably complicates the integrated circuit manufacturing process. Products from reactive-ion etching of lead-containing compounds have low volatilities; thus, reaction products tend to deposit on the interior of the etch machine. Removal of lead-containing residues requires frequent cleaning of the etch machine interior by manual wiping. Not only must the machine operators deal with toxic materials but also management must ensure that toxic materials removed from etch machines are properly treated and transported to a toxic waste material storage facility.

From the foregoing background discussion, it can be concluded that there is a need to improve on the prior art structures and processes for interconnecting integrated circuit chips. Whether provided on integrated circuit chips or on another substrate together with the conductive lines for interconnecting chips, a capacitor structure that does not incorporate lead or other heavy metals is needed. If the capacitor structure is provided on integrated circuit chips, a structure that incorporates only materials compatible with standard integrated circuit manufacturing processes is needed. Whether formed on the integrated circuit chip or on another substrate, a structure and process that can provide capacitance values in the 100–500 picofarad range and occupy an area no greater than 5,000–10,000 square micrometers is needed. Whether capacitors are provided on integrated circuit chips or on another substrate, a process that is amenable to high volume manufacturing is needed for forming capacitors and interconnect lines.

It is therefore the principal object of the present invention to provide a multi-region material structure and process for forming capacitors and interconnect lines for use with integrated circuits.

This and other objects are accomplished in accordance with the present invention by material structures that: (1) provide capacitor first or bottom electrodes comprised of a transition-metal nitride; (2) provide a capacitor dielectric comprised of a transition-metal oxide; (3) provide capacitor second or top electrodes comprised of a transition-metal nitride, a metal or multiple conductive material layers; (4) provide one or more levels of interconnect lines; (5) provide electrical insulation between adjacent regions as required by the application; and (6) provide bonding between two regions when such bonding is required to achieve strong region-to-region adhesion or to achieve a region-to-region interface that has a low density of electrical defects. The multi-step process for forming the material structures involves formation of the capacitor dielectric on the first electrode surfaces by conversion of a conductive transition-metal nitride to an insulating transition-metal oxide. The process also involves formation of low-defect-density interfaces between capacitor second electrodes and the capacitor dielectric.

DETAILED DESCRIPTION OF THE INVENTION

Figure 1:
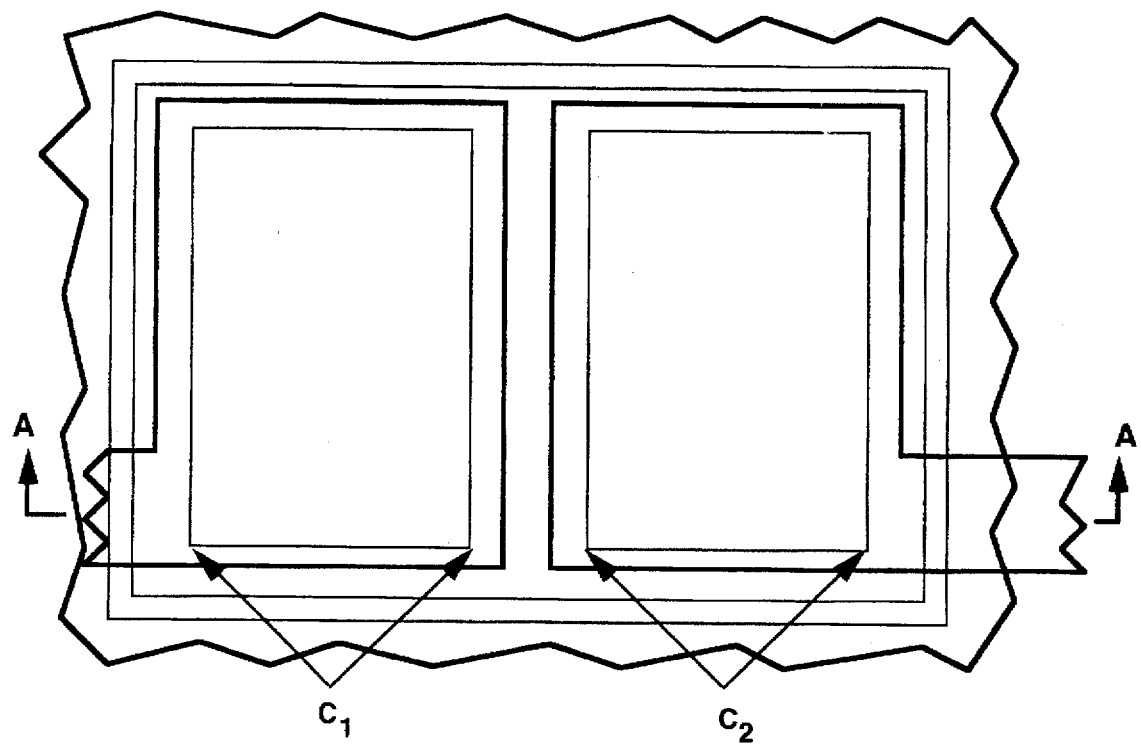
FIG. 1 is a top view illustration of two capacitors formed in accordance with the present invention with an interconnect line extending from a second or top electrode of each capacitor.

Several properties of transition-metal nitrides and transition-metal oxides are important in the present invention. Certain transition-metal nitrides are conductors, while certain transition-metal oxides are very good insulators. See R. C. Weast, Editor, Handbook of Chemistry and Phyics, 56th Edition, pp. D54–D58, 1975–76. Transition-metal oxides can be grown on the surface of transition-metal nitrides because energy is released in converting the nitride compound to the oxide compound. See I. Suni, D. Sigurd, K. T. Ho, and M. A. Nicolet, "Thermal Oxidation of Reactively Sputtered Titanium Nitride and Hafnium Nitride Films," Journal of the Electrochemical Society, Vol. 130, No. 5, pp. 1210–1214, May, 1983. Defect-free titanium oxide is very resistant to etching by chemical reactions; titanium nitride is readily etched by mixtures of acids or ammonium hydroxide and hydrogen peroxide and by plasma-promoted chemical reactions. See E. T. Fitzgibbons, K. J. Sladek, and W. H. Hartwig, "TiO$_2$ Film Properties as a Function of Processing Temperature," Journal of the Electrochemical Society, Vol. 119, No. 6, pp. 735–739, June, 1972; P. J. Rosser and G. J Tomkins, "Self-Aligned Nitridation of TiSi$_2$: A TiN/TiSi$_2$ Contact Structure," Materials Research Society Symposium Proceedings, Vol. 37, pp. 607–612, 1985; M. E. Alperin, T. C. Hollaway, and R. A. Haken, "Development of the Self-Aligned Titanium Silicide Process for VLSI Applications," IEEE Transactions on Electron Devices, Vol. ED-32, No. 2, pp. 141–19, February, 1985; and P. E. Riley, S. S. Peng, and L. Fang, "Plasma Etching of Aluminum for ULSI Circuits," Solid State Technology, pp. 47–55, February, 1993. As with titanium oxide, defect-free films comprised of other transition-metal oxides should be resistant to chemical etchants. As with titanium nitride, films comprised of other transition-metal nitrides should be reactive with wet-chemical and plasma etchants. Transition metals react with silicon to form silicides, and the transition-metal silicides are conductors. See Handbook of Chemistry and Physics, supra. Titanium nitride films of good quality can be deposited by reactive sputtering or CVD. See U.S. Pat. No. 5,070,036 to Stevens; E. O. Travis, W. M. Paulson, F. Pintchovski, B. Boeck, L. C. Parrillo, M. L. Kottke, K.-Y. Fu, M. J. Rice, J. B. Price, and E. C. Eichman, "A Scalable Submicron Contact Technology Using Conformal LPCVD TiN," Technical Digest of the International Electron Devices Meeting, pp. 47–50, 1990; and U.S. Pat. No. 5,139,825 to Gordon et al. The reactive sputtering and CVD processes that have been used for titanium nitride films can be modified and used for other transition-metal nitride films. Finally, it is known that several transition metals, notably tantalum, titanium, and vanadium, and the nitrides and silicides of these metals, are compatible with the materials and processes typically utilized in manufacturing integrated circuits and other semiconductor devices.

The structure and process of the present invention may be understood with reference to the nine appended drawing figures. FIGS. 1–4 illustrate capacitor structures wherein no opening is made through the capacitor dielectric. FIGS. 5–9 illustrate capacitor structures wherein electrical connection to one capacitor electrode is made at an opening through the capacitor dielectric.

Referring now to FIG. 1, there is shown a top-side view of a representative capacitor structure. The labels $C_1$ and $C_2$ identify two areas where a capacitor electrode is formed over the upper surface of the capacitor dielectric. Extensions of the capacitor electrodes to form interconnect lines are indicated at the lower left and lower right portions of FIG. 1. The labels A—A denote the plane for a representative cross-sectional view.

Figure 2:
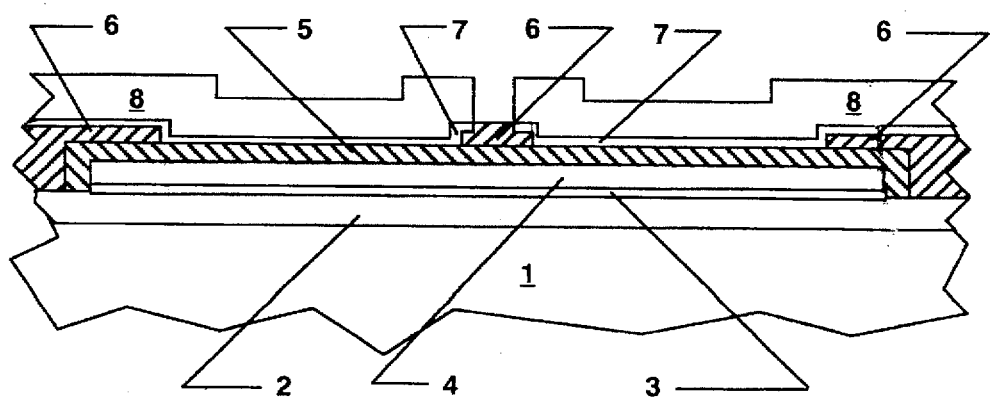
FIG. 2 is a cross section illustration of the material structure within the capacitors shown in FIG. 1.
Figure 3:
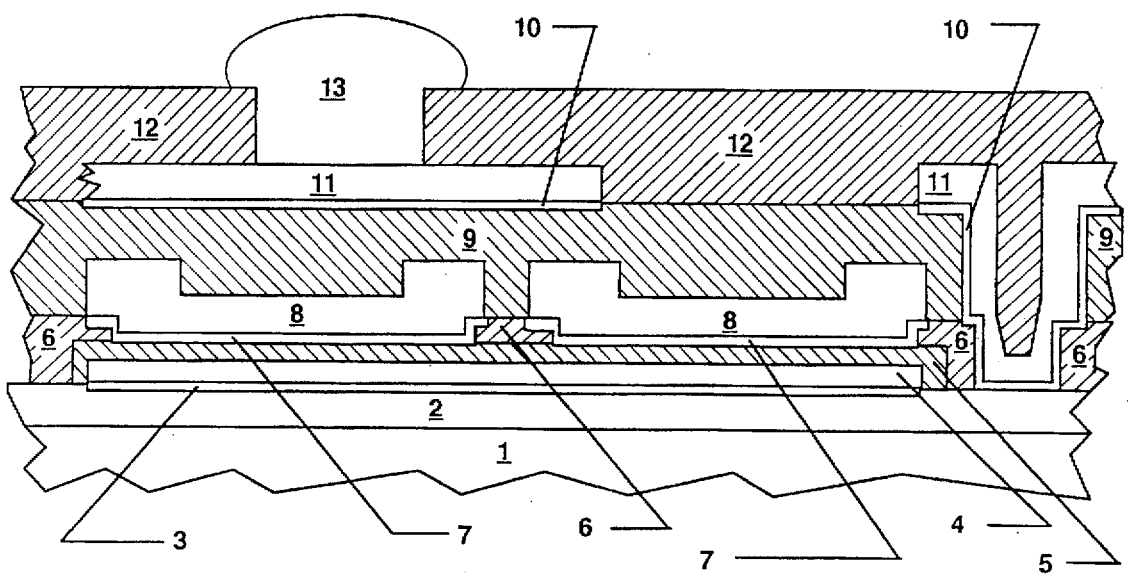
FIG. 3 is an illustration of material regions that may be provided in addition to the material regions shown in FIG. 2.
Figure 4:
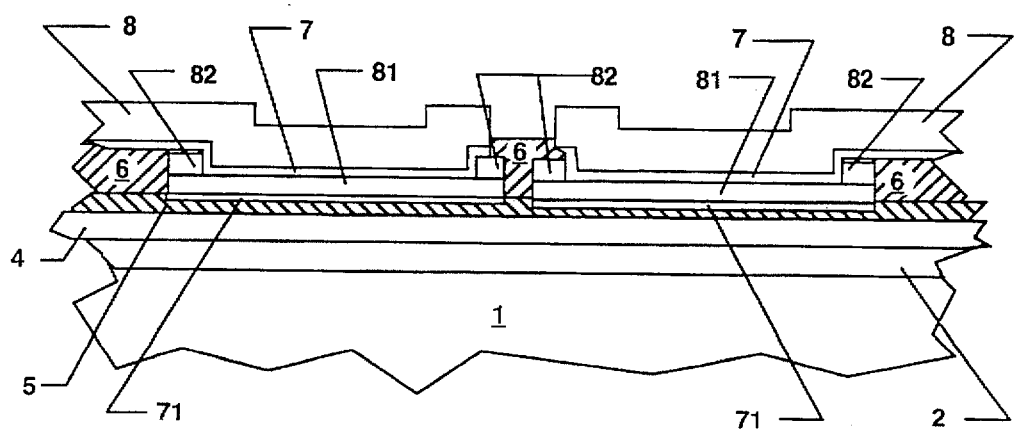
FIG. 4 is an illustration of a material structure within the capacitors formed in accordance with the present invention that results when a continuous sequence of process steps is employed to form a first capacitor electrode, a capacitor dielectric, and a second capacitor electrode.

Material structure along the plane labeled A—A in FIG. 1 is depicted in FIG. 2. Region 1 is a substrate upon which various material regions may be added to form capacitors and conductive lines for interconnecting capacitors and other devices. Depending on the application and the manufacturing method employed, region 1 may comprise an insulator, a semiconductor, a conductor or a composite structure of two or more layers. A two-layer substrate comprising a layer 2 contained within and at the surface of region 1 is illustrated in FIG. 2. In the case that region 1 is an insulator, preferred materials are ceramics comprised primarily of aluminum oxide or aluminum nitride. In the case that region 1 is a semiconductor, the preferred material is silicon doped with boron, arsenic, antimony, phosphorus or arsenic and phosphorus to a dopant concentration of 1E14 to 1E21 per cubic centimeter. In the case that region 1 is a conductor, preferred materials are refractory metals such as tungsten or molybdenum. In the general case that region 1 comprises two or more layers, the layers may be: a dielectric (insulator) layer overlying a conductive layer; a conductive layer overlying a dielectric layer; a refractory-metal layer overlying a semiconductor wafer; a semiconductor layer of preferable thickness 0.2 to 2.5 micrometers doped with a first dopant to a concentration of 1E17 to 1E21 per cubic centimeter overlying a semiconductor wafer doped with a second dopant to a concentration of 1E14 to 9E16 per cubic centimeter; a layer of thickness 100–500 nanometers comprising tungsten silicide, titanium silicide, tantalum silicide, molybdenum silicide, vanadium silicide or another transition-metal silicide overlying a silicon wafer doped with boron, arsenic, antimony, phosphorus, or arsenic and phosphorus to a dopant concentration ranging from 1E14 to 1E21 per cubic centimeter; or a dielectric layer overlying an integrated circuit, the integrated circuit being a semiconductor wafer and all of the material regions and material layers required to form the integrated circuit. In the case that region 1 comprises a semiconductor layer doped with a first dopant overlying a semiconductor wafer doped with a second dopant, preferred structures are obtained by selecting silicon as the semiconductor material; selecting the first dopant from among boron, arsenic, antimony, phosphorus, or arsenic and phosphorus; and selecting the second dopant from among boron, arsenic, antimony, phosphorus, or arsenic and phosphorus. In the case that region 1 comprises a dielectric layer overlying an integrated circuit, electrical connections between the structure of the present invention and the integrated circuit can be made through openings provided through the dielectric layer; and, also in the case that region 1 comprises a dielectric layer overlying an integrated circuit, preferred choices for the semiconductor material within the integrated circuit are: silicon, gallium arsenide, indium phosphide, gallium-aluminum arsenide or germanium. Referring again to FIG. 2, region 4 comprises nitrogen compounded with a transition metal. Because their compatibility with integrated circuit manufacturing is well established, tantalum or titanium is a preferred choice for the transition metal utilized in region 4. Preferred thicknesses for region 4 range from 50–500 nanometers. Region 5 comprises oxygen compounded with the same transition metal that is compounded with nitrogen to form region 4. Preferred thicknesses for region 5 range from 10–500 nanometers. Region 4 may be patterned as illustrated in FIGS. 1, 2 and 3, or it may overlie the entire substrate, as illustrated in FIG. 4. In the case that region 4 is patterned, region 5 overlies the top and side surfaces of region 4. In the case that region 4 overlies the entire substrate, region 5 overlies the entire top surface of region 4. Region 6 is a dielectric layer that is deposited on the the underlying regions. In some cases, region 6 may include both a dielectric layer grown on a portion of the upper surface of region 1 and a layer of deposited dielectric material. Preferred thicknesses for region 6 range from 0.2–20 micrometers. Preferred materials for region 6 are silicon oxide doped with boron, phosphorus, arsenic, or boron and phosphorus, polyimides, benzocyclobutene, silicon oxynitride, and a polyimide or benzocyclobutene overlying silicon oxide doped with boron, phosphorus, arsenic, or boron and phosphorus. Referring again to FIGS. 1 and 2, openings are provided through region 6 to define the areas where capacitor second electrodes are formed on top of the capacitor dielectric, region 5. Two such openings, which are labeled $C_1$ and $C_2$, are illustrated in FIG. 1. Region 4 is utilized to form first or bottom electrodes for capacitors. Region 8 is utilized to form second or top electrodes for capacitors and to form interconnect lines. As illustrated in FIG. 1, lines formed by patterning region 8 may extend from capacitor electrodes to terminals of other devices that are integrated with capacitors. Region 8 may also be patterned to form lines that interconnect devices other than capacitors. Because region 8 is utilized for capacitor second electrodes, it must be compatible with forming a low-defect interface between electrodes and the capacitor dielectric. Depending on requirements imposed by the application, region 8 may comprise transition-metal nitrides, transition-metal borides, transition-metal carbides, conductive-metal oxides such as indium-tin oxide or ruthenium oxide, metals such as copper, gold, aluminum or aluminum alloys, polycrystalline silicon doped with arsenic, antimony, phosphorus, boron, or arsenic and phosphorus, refractory metals such as tungsten or molybdenum or a composite structure comprising two or more conductive layers.

Referring again to FIG. 2, from consideration of process simplicity and materials compatibility, a first preferred material structure for region 8 is a transition metal compounded with nitrogen to form a conductive layer, the layer having a thickness between 50–500 nanometers. From considerations of the needs for low interconnect line resistance and materials compatibility, a second preferred material structure for region 8 is a metal or metal alloy layer overlying a transition-metal nitride layer with an interconnect material bonding layer sandwiched between the metal or metal alloy layer and the transition-metal nitride layer. From consideration of the needs for low interconnect-line resistance, high interconnect-line reliability, and materials compatibility, a third preferred material structure for region 8 is a metal or metal alloy layer overlying a transition-metal nitride layer with a first interconnect-material bonding layer sandwiched between the metal or metal alloy and the underlying transition-metal nitride layer; and a transition-metal oxynitride layer overlying the metal or metal alloy layer, with a second interconnect-material bonding layer sandwiched between the metal or metal alloy layer and the overlying transition-metal oxynitride layer. Within these second and third preferred alternative material structures for region 8, preferred thickness ranges are: 0.2–1.0 micrometers for the metal or metal alloy layer, 10–100 nanometers for the transition-metal nitride and transition-metal oxynitride layers, and 5–20 nanometers for the interconnect-material bonding layers. Preferred means for forming the interconnect-material bonding layers are depositon of a transition-metal layer or a transition-metal nitride layer which incorporates an excess of the transition metal followed by reacting the deposited transition metal or transition-metal nitride which contains an excess of the transition metal with the underlying and overlying layers at a temperature in the range of 400–500 degrees C. Within these second and third preferred alternative material structures for region 8, preferred metals or metal alloys include: aluminum; aluminum with 0.1–1 weight percent silicon and 0.1–4 weight percent of a metal selected from among titanium, palladium, platinum or copper; and copper. These second and third preferred alternatives for the material structure of region 8 are substantially the structures for interconnect lines that are described in U.S. Pat. No. 4,977, 440 to Stevens.

Referring again to FIG. 2, when required to obtain acceptable adhesion between regions or when required to obtain a low-defect interface between regions, the material bonding regions 3 and/or 7 may be incorporated within the capacitor structure. Material bonding region 3 comprises products from reacting a transition metal or a transition-metal nitride which incorporates an excess of the transition metal with constituents of the surface layer of the substrate region 1 and with the transition-metal nitride comprising region 4. Material bonding region 7 comprises products from reacting a transition metal or a transition-metal nitride which incorporates an excess of the transition metal with the transition-metal oxide that comprises region 5 and with constituents of region 8. The reaction that forms the final compositions of regions 3 and 7 is promoted by an anneal at a temperature preferably in the range of 400–700 degrees C. Preferred thicknesses for regions 3 and 7 are in the range of 5–20 nanometers. Titanium is a preferred transition metal for utilization in material bonding regions 3 and 7.

Whether or not electrical connections are made to capacitor first electrodes, capacitors may be integrated with other devices using the structure shown in FIGS. 1 and 2. If, for example, no connection is made to the first electrode, then the equivalent capacitance between the two second electrodes shown in FIG. 1 is given by the well-known formula for series capacitors: $C_{EQ}=C_1C_2/(C_1+C_2)$. Otherwise, if electrical contact is made to a substrate that comprises a conductive material or to a substrate that comprises a conductive surface layer that overlies an insulator, then, referring to FIG. 1, capacitances $C_1$ and $C_2$ between the second and first electrodes may be independently utilized to perform circuit functions.

Referring again to FIG. 1, it is worthy to note that approximately the same capacitance can be achieved within a given area whether or not electrical contact is made to the first electrode. When no electrical contact is made to the first electrode, a potentional difference applied between second electrodes $C_1$ and $C_2$ is distributed across two capacitor dielectric region thicknesses, and the circuit capacitance is equivalent to $C_1$ and $C_2$ in series. Otherwise, if contact is made to the first electrode and a potential difference is applied between the first and second electrodes, the potential is dropped across one capacitor dielectric region thickness. In the present invention wherein a transition-metal oxide is utilized for the capacitor dielectric, minimum dielectric thickness is set by the requirement that the electric field within the dielectric be less than the value that will break down or destroy the dielectric. At an applied potential difference determined by the application, it follows that the minimum dielectric thickness for capacitors contacted only at second electrodes is one-half the minimum dielectric thickness for capacitors with connections made to both first and second electrodes. Since capacitance per unit area is inversely proportional to dielectric thickness, it follows that approximately the same breakdown-limited capacitance per unit area can be achieved whether or not the capacitor structure provides for contacts to capacitor first electrodes.

Referring now to FIG. 3, shown are material regions which can be added to the structure shown in FIG. 2. In FIG. 3, regions 1–8 are the same regions identified in FIG. 2. Region 9 is a dielectric layer that is deposited over the underlying regions. Preferred materials for region 9 include silicon dioxide doped with boron, phosphorus, or boron and phosphorus, silicon oxynitride, silicon nitride, polyimides, and benzocyclobutene. Preferred thicknesses for region 9 range from 0.2–20 micrometers. Openings (not shown in FIG. 3) are provided through region 9 to allow access to conductive region 8. Openings through region 9 that are concentric with openings through dielectric region 6 may be provided to allow access to the upper surface of the substrate i at sites where region 6 directly overlies the substrate. Region 11 is utilized for interconnect lines. These lines may contact the substrate, capacitor second electrodes, and terminals of other devices. Region 11 may comprise metals, metal alloys or layered structures. The compositions and thicknesses of the metals, metal alloys or layered structures used to form region 11 are the same as those described previously for region 8. Region 10 is a third material bonding layer. Preferred compositions and thicknesses for region 10 are the same as those previously described for regions 3 and 7. Region 12 is a dielectric layer that is deposited over the underlying regions. Region 12 provides both electrical insulation and protection of the underlying regions. Preferred materials for region 12 are silicon dioxide doped with boron, phosphorus, or boron and phosphorus, silicon oxynitride; silicon nitride; polyimides; benzocyclobutene; or titanium dioxide overlying doped silicon dioxide. Preferred thicknesses for region 12 range from 0.5–1.0 micrometers. If required by the application, conductive bump region 13 may be provided on the structure. Region 13 may comprise a conductive epoxy compound that is deposited over openings provided through region 12. When region 13 comprises a conductive epoxy compound, devices such as integrated circuit chips may be connected to the structure of the present invention during the process of curing the epoxy. Alternatively, region 13 may comprise a solder that melts and flows at a temperature less than about 400 degrees C., provided that the upper layer of region 11 comprises a metallurgic barrier material such as titanium nitride or titanium oxynitride. When region 13 comprises a solder, devices such as integrated circuit chips may be connected to the structure of the present invention during reflow (remelting) of the solder.

The structure shown in FIG. 4 is similar to the structure of FIG. 2, but capacitor second electrodes are formed from regions 81 and 82 in the structure of FIG. 4 rather than being formed from region 8 as in the structure of FIG. 2. In FIG. 4, each of the regions 1–8 is of the same composition as the correspondingly numbered region 1n FIG. 2. The capacitor second electrode region 81 may comprise aluminum; an aluminum alloy; polycrystalline silicon doped with boron, arsenic, phosphorus, or arsenic and phosphorus; or a transition metal nitride. The preferred thickness for region 81 is in the range of 50–500 nanometers. If a transition metal nitride is chosen as the material for region 81, then region 82 must be provided to protect region 81 if oxidizing atmospheres are utilized during thermal treatments done subsequent to deposition of region 81. Region 82 may comprise polycrystalline silicon, aluminum or silicon nitride. If region 82 comprises silicon nitride, then, as shown in FIG. 4, an opening must be provided through region 82 to allow electrical contact between regions 8 and 81. Preferred thickness for region 82 is in the range of 20–500 nanometers. Region 81 and also region 82, if included, are patterned to form capacitor second electrode features. If required to achieve adequate adhesion between regions 81 and 5 or to achieve a low-defect interface between regions 81 and 5, material bonding region 71 may be included. If it is included, region 71 may comprise titanium, nitrogen, and oxygen. Preferred thickness for region 71 ranges from 5–20 nanometers. Dielectric region 6 is deposited after formation of capacitor second electrode features. Openings are provided through region 6 to allow electrical connections between interconnect lines and capacitor electrodes. Interconnect lines are formed by depositing and patterning conductive region 8. If required by the application, some or all of the material regions 9–13 that are shown in FIG. 3 can be added to the structure shown in FIG. 4. Compared to the structure of FIG. 2, the structure of FIG. 4 has the advantage that the interface between the capacitor second electrode and the capacitor dielectric is not exposed to an etch process.

Figure 7:
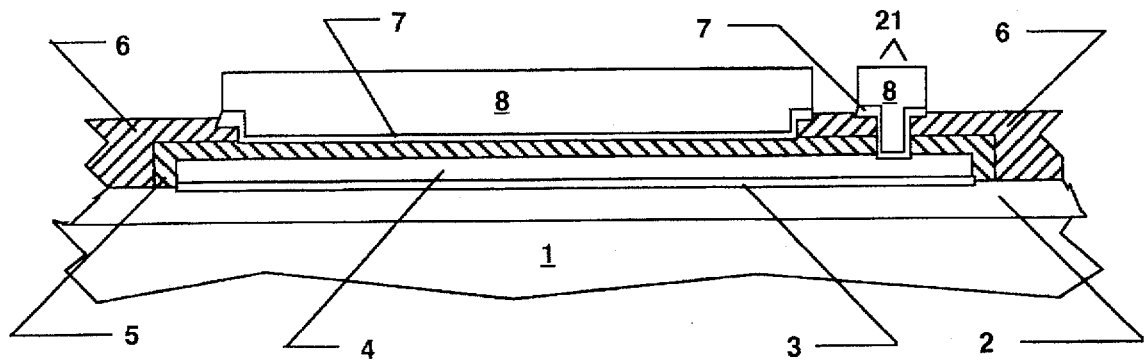
FIG. 7 is a cross section illustration of the material structure within the capacitor shown in FIG. 5.

The preferred methods that may be employed to form the structures of the present invention may be understood with reference to the cross section views shown in FIGS. 2, 4, and 7. Referring to those figures, the substrate 1, in general, may be formed using well known methods for growing or depositing and then patterning layers of insulating and conductive materials. For the case that region 1 is a semiconductor, layer region 2 shown in FIG. 2 can be formed by implanting the ions of boron, phosphorus, arsenic, antimony, arsenic and phosphorus or other dopants appropriate for the semiconductor followed by an activation anneal at a temperature in the range of 700–1000 degrees C. For the case that region 1 comprises silicon, layer region 2 can be formed by reacting a transition metal with the silicon to form a transition-metal silicide. Patterning of region 2 is not indicated in FIG. 2; however, it can be patterned to form features within the substrate region 1, if such region 2 features are useful in the application. If it is formed by implanting ions, patterning of layer region 2 can be accomplished by implanting the ions through openings in a mask comprising, for example, photoresist or silicon dioxide. If it comprises a transition-metal silicide, patterning of layer region 2 can be accomplished by depositing and patterning the transition metal prior to reacting the transition metal with silicon. For the case that the substrate 1 comprises a silicon wafer with an overlying layer of silicon dioxide, patterning of a layer region 2 that comprises a metal silicide can also be accomplished by: etching openings through the silicon dioxide layer to provide access to the silicon wafer surface; forming a layer of the transition metal that overlies the silicon dioxide and that overlies the silicon at the openings etched through the silicon dioxide; reacting the transition metal with silicon to form transition-metal silicide features at the openings through the silicon dioxide; removing the unreacted transition metal using a wet chemical or plasma process that etches the transition metal more rapidly than the transition-metal silicide; and, optionally, removing the silicon dioxide layer by using an etchant that includes hydrofluoric acid.

Referring now to FIG. 2, chemical vapor deposition (CVD) can be employed in a method for forming capacitors. The substrate is inserted into a CVD reactor; then, an atmosphere comprising an inert gas such as argon or helium is established. A pressure in the range of 0.1–760 torr is established; then, the substrate is heated to a temperature in the range of 400–700 degrees C. Following stabilization of the substrate temperature, a titanium layer may be deposited prior to formation of first electrode region 4, if material bonding region 3 is required to promote adhesion between region 4 and the substrate. The titanium layer is deposited by introducing hydrogen and a volatile compound of titanium into the gas mixture. After a titanium layer has been established with a desired thickness in the range of 5–20 nanometers, the reactor atmosphere is changed to a mixture of nitrogen or ammonia ($NH_3$), a volatile compound of titanium, and, optionally, an inert gas such as argon or helium. The volatile compound of titanium reacts with the nitrogen or ammonia to form the titanium nitride region 4. It should be noted that the volatile compound of titanium utilized during formation of the titanium nitride region 4 may be different from the volatile compound of titanium utilized during formation of optional material bonding region 3. If material bonding region 3 is provided, the composition of region 3 is formed by reacting the deposited titanium layer with the surface of the substrate and the overlying titanium nitride during the deposition of region 4. After region 4 has been established with a thickness in the range of 50–500 nanometers, the reactor atmosphere is changed to an inert gas or nitrogen, and substrate temperature is lowered to a value in the range of 20–200 degrees C. Then, the substrate with the now-established region 4 and region 3 (if provided) is removed from the CVD reactor.

Referring again to FIG. 2, sputtering can be employed in a method for forming capacitors. The substrate is inserted into a sputter deposition machine; then, substrate temperature is set to a value in the range of 20–400 degrees C., and machine-chamber pressure is set to a value in the range of 1–100 millitorr. A titanium layer may be deposited prior to formation of first electrode region 4, if material bonding region 3 is required to promote adhesion between region 4 and the substrate. A layer of titanium having a thickness in the range of 5–20 nanometers can be deposited by sputtering from a titanium target using argon ions. Next, a layer of titanium nitride having a thickness in the range of 50–500 nanometers is deposited by sputtering from a titanium target using a plasma that contains both argon and nitrogen ions. If material bonding region 3 is provided, the composition of region 3 is formed by reacting the deposited titanium layer with the surface of the substrate and the overlying titanium nitride during the deposition of region 4. After region 4 has been established, substrate temperature is lowered to a value in the range of 20–200 degrees C. Then, the substrate with the now-established region 4 and region 3 (if provided) is removed from the sputter deposition machine.

The method for forming the structure shown in FIG. 2 continues after removal of the substrate with the now-established regions from either the CVD reactor or the sputter deposition machine. Capacitor first electrode features are defined using photolithographic techniques in conjunction with a wet chemical etch or a plasma etch to pattern region 4 and, if provided, region 3. Then, capacitor dielectric region 5 is grown at a temperature in the range of 400–700 degrees C. in an atmosphere comprised of argon or helium mixed with an oxidant, with the oxidant being held at a low partial pressure. Following growth of the capacitor dielectric region 5o dielectric region 6 is deposited by well known methods. If region 6 comprises a polyimide or benzocyclobutene, the deposition method typically involves application of a liquid precursor material by a spinning, spraying or dipping procedure followed by a polymer formation at a temperature in the range of 200–400 degrees C. If region 6 comprises doped silicon dioxide, silicon nitride or silicon oxynitride, one of the well known CVD methods is preferred for deposition. If the structure is to be exposed to temperatures in excess of the polymer formation temperature subsequent to deposition of region 6, then a polyimide or benzocyclobutene is not a preferred material choice for region 6. Following deposition of region 6, openings as required to provide access to the capacitor dielectric and to the substrate are provided through region 6 by using appropriate photolithographic techniques in conjunction with a wet chemical etch or plasma etch. Regions 7 and 8 shown in FIG. 2 may now be deposited either by CVD or by sputtering.

Referring again to FIG. 2, if CVD is used to deposit regions 7 and 8, the substrate with the established overlying layers is inserted into a CVD reactor; then, an atmosphere comprising an inert gas or nitrogen at a pressure in the range of 0.1–760 torr is established. The substrate with the overlying layer regions is heated to a temperature in the range of 400–700 degrees C., and the temperature is allowed to stabilize. If material bonding region 7 is provided in the structure, nitrogen or ammonia and a volatile compound of titanium are introduced into the gas mixture, and a region 7 comprising titanium nitride with excess titanium is deposited to a thickness in the range of 5–20 nanometers; then, the gas mixture is changed to nitrogen or an inert gas while the process for forming region 8 is set up. Next, the reactor atmosphere is changed to one of the following mixtures: nitrogen or ammonia and a volatile compound of titanium; an inert gas, hydrogen, and a volatile compound of copper; an inert gas, hydrogen, and a volatile compound of aluminum; an inert gas, hydrogen, and volatile compounds of aluminum, silicon, and titanium; or an inert gas, hydrogen, and volatile compounds of aluminum, silicon, and copper. Then, region 8 is deposited to a layer thickness in the range of 0.05–1.0 micrometers. When the desired thickness for region 8 is reached, the gas mixture is changed to an inert gas, the substrate temperature is reduced to the range of 20–200 degrees C., and the wafer with all of the regions shown in FIG. 2 is removed from the reactor.

Referring again to FIG. 2, if sputtering is used to deposit regions 7 and 8, the substrate with the established overlying layers is inserted into a sputter deposition machine. Next, the substrate with the overlying layer regions is brought to a temperature in the range of 20–500 degrees C. If material bonding region 7 is provided in the structure, a region 7 layer having a thickness in the range of 5–20 nanometers is deposited by sputtering either from a titanium target using argon ions to deposit titanium or sputtering from a titanium target using a mixture of argon and nitrogen ions to deposit titanium nitride that incorporates excess titanium. Then, region 8 is deposited to a thickness in the range of 0.05–1.0 micrometers using both argon and nitrogen ions to sputter material from a titanium target and/or using argon ions to sputter material from a target comprised of one of the following: copper; aluminum; aluminum with 0.1–1 weight percent silicon; or aluminum with 0.1–1 weight percent silicon and 0.1–4 weight percent of one of the metals copper, titanium, palladium or platinum. Next, the substrate with the overlying layers is brought to a temperature in the range of 20–200 degrees C., and the substrate with all of the regions shown in FIG. 2 now established is removed from the sputtering machine.

Finally, whether regions 7 and 8 are established by CVD or by sputtering, the structure shown in FIG. 2 is completed by using photolithographic techniques in conjunction with either a wet chemical etch or a plasma etch to pattern regions 7 and 8, and to thereby form interconnect lines.

Referring now to FIG. 4, chemical vapor deposition can be advantageously employed in a method for forming capacitors. Substrate region i is, in this method, a silicon wafer doped with boron, arsenic, antimony, phosphorus, or arsenic and phosphorus to a dopant concentration in the range of 1E14 to 1E21 per cubic centimeter. The silicon wafer may be formed by any of the methods that are well known in the prior art. The silicon wafer is inserted into a CVD reactor; then, an atmosphere comprising hydrogen mixed with an inert gas such as argon or helium is established. A pressure in the range of 0.1–760 torr is established; then, the wafer is heated to a temperature in the range of 400–700 degrees C. Following stabilization of the wafer temperature, a volatile compound of titanium is introduced into the gas mixture. The volatile compound of titanium reacts to form the layer region 2 of titanium silicide near the wafer surface where the wafer surface is exposed to the gas mixture. After region 2 comprising titanium silicide has been established with a desired thickness in the range of 100–500 nanometers, the reactor atmosphere is changed to a mixture of nitrogen or ammonia ($NH_3$), a volatile compound of titanium, and, optionally, an inert gas such as argon or helium. The volatile compound of titanium reacts with the ammonia or nitrogen to form the titanium nitride layer region 4 that is deposited over the titanium silicide layer. Deposition of a material bonding layer between the titanium silicide and the titanium nitride is not required because a thin titanium layer or a thin titanium rich layer overlies the titanium silicide region 2 prior to deposition of the titanium nitride layer. Note that the volatile compound of titanium utilized during formation of the titanium nitride region 4 may be different than the volatile compound of titanium utilized during formation of the titanium silicide region 2. After a titanium nitride layer region 4 having a desired thickness in the range of 50–500 nanometers has formed, the reactor atmosphere is changed to a dilute mixture of an oxidant in an inert gas such as argon or helium, and the exposed surface of the titanium nitride layer is converted to titanium dioxide by reacting with the oxidant component of the atmosphere. After a titanium dioxide layer having a desired thickness in the range of 10–500 nanometers has grown over the surface of the titanium nitride, flow of the oxidant gas is terminated, and the wafer with the now-formed titanium silicide, titanium nitride, and titanium dioxide layers is annealed for a time interval ranging from 10 seconds to 10 minutes to allow the escape of reactant products from the titanium nitride and titanium dioxide layers. Next, an optional material bonding region 7 of titanium having a layer thickness in the range of 5–20 nanometers may be deposited by changing the atmosphere to a mixture of hydrogen, a volatile compound of titanium, and an inert gas. Then, the atmosphere is changed to a mixture of nitrogen or ammonia, a volatile compound of titanium, and an optional inert gas. After a titanium nitride region 81 having a layer thickness in the desired range of 50–500 nanometers has been deposited, the atmosphere is changed to an inert gas or nitrogen, and the structure is annealed for a time interval ranging from 10 seconds to 10 minutes. Next, a region 82 comprising polycrystalline silicon, silicon nitride or aluminum is deposited to protect the titanium nitride from oxidizing atmospheres. In the case that the region 82 comprises polycrystalline silicon, deposition is accomplished by changing the reactor atmosphere to a mixture of silane and an inert gas. In the case that the region 82 is silicon nitride, deposition is accomplished by changing the reactor atmosphere to a mixture of silane or dichlorosilane and ammonia. In the case that the region 82 is aluminum, deposition is accomplished by changing the reactor atmosphere to a mixture of an inert gas, hydrogen, and a volatile compound of aluminum. After a protective region 82 having a layer thickness in the range of 20–500 nanometers has been established, the reactor atmosphere is changed to nitrogen or an inert gas. Finally, the temperature is lowered to a value between 20–200 degrees C., and the substrate now with overlying CVD-deposited layers is removed from the reactor. The preceding method is particularly advantageous because all layer regions of capacitors are formed by a sequence of processes within a single CVD reactor and, further, because interfaces between capacitor electrodes and the capacitor dielectric are formed between the compatible materials titanium nitride and titanium dioxide.

Referring again to FIG. 4, sputtering can be advantageously employed in a method for forming capacitors. Substrate region 1 is a silicon wafer doped with boron, arsenic, antimony, phosphorous, or arsenic and phosphorus to a dopant concentration in the range of 1E14 to 1E21 per cubic centimeter. The doped silicon wafer may be formed by any of the methods that are well known in the prior art. The wafer is inserted into a sputter machine; wafer temperature is set to a value in the range of 400–700 degrees C.; and machine chamber pressure is set to a value in the range of 1–100 millitorr. Then, a layer of titanium having a thickness in the range of 50–250 nanometers is deposited by sputtering from a titanium target using argon ions. Next, a layer of titanium nitride having a thickness in the range of 50–500 nanometers is deposited by sputtering from a titanium target using a plasma that contains both argon and nitrogen ions. Deposition of the titanium layer followed by deposition of the titanium nitride layer is effective in forming regions 2 and 4. Next, pressure within the sputter machine deposition chamber is set to a value in the range of 0.1–100 torr with the atmosphere being a mixture of argon and oxygen, and region 5, comprising titanium dioxide and having a layer thickness in the range of 10–500 nanometeres, is grown over the surface of the titanium nitride. Following growth of the titanium dioxide, the flow of oxygen is terminated, and chamber pressure is set again to a value in the range of 1–100 millitorr. Then, an optional bonding region 71 of titanium having a layer thickness in the range of 5–20 nanometers may be deposited from a titanium target using argon ions. Next, a region 81 of titanium nitride having a layer thickness in the range of 50–500 nanometers is deposited by sputtering from a titanium target using a mixture of argon and nitrogen ions. After this step, regions, 1, 2, 4, 71 (optional), and 81 have all been deposited. Note that using one titanium target for sputter deposition of titanium layers and using a second titanium target for sputter deposition of titanium nitride films is preferred to using a single target for both films because reactive sputtering with nitrogen alters the target surface. After deposition of titanium nitride region 81, a region 82 comprising aluminum or an aluminum alloy is deposited from an aluminum or aluminum alloy target using argon ions. The aluminum or aluminum alloy layer thickness is preferably in the range of 200–500 nanometers. If an aluminum alloy target is utilized, target composition may be aluminum with 0.1–1 weight percent silicon or aluminum with 0.1–1 weight percent silicon and 0.1–4 weight percent of one of the metals copper, titanium, palladium or platinum. Next, wafer temperature is lowered to a value in the range of 20–200 degrees C., and the wafer now with overlying sputter-deposited layers is removed from the sputter deposition machine. The preceding method is particularly advantageous because all layer regions of capacitors are formed by a sequence of processes within a multiple-target sputter deposition machine and, further, because interfaces between capacitor electrodes and the capacitor dielectric are formed between the compatible materials titanium nitride and titanium dioxide.

The method for forming the structure shown in FIG. 4 continues after removal of the wafer and the now-formed regions from either the CVD reactor or the sputter deposition machine. At this step in the process, the multi-region structure includes: the doped silicon wafer; region 2 comprising titanium silicide; region 4 comprising titanium nitride; region 5 comprising titanium dioxide; optional material bonding region 71 comprising titanium, nitrogen, and oxygen; region 81 comprising titanium nitride; and region 82. Depending on whether it was formed by the CVD method or by sputter deposition, region 82 may comprise polycrystalline silicon, silicon nitride, aluminum or an aluminum alloy. Capacitor second electrode features are defined by patterning titanium nitride region 81 and region 82. The patterning is accomplished by using photolithographic techniques in conjunction with a wet chemical etch process or in conjunction with a plasma etch process. First, layer region 82 is etched using an appropriate wet chemical solution or a plasma process from the well known prior art for etching polycrystalline silicon, silicon nitride or aluminum. In a generally applicable method, layer region 81 then is etched using a solution comprising water, hydrogen peroxide, and ammonium hydroxide; using a solution comprising water, hydrogen peroxide, and hydrochloric or sulfuric acid; or using a plasma process. In a preferred method when region 82 comprises silicon nitride, the structure is exposed to an oxidizing atmosphere following patterning of region 82, and the portion of region 81 not covered by region 82 features is thereby converted to titanium dioxide. After defining capacitor second electrode features, regions 6, 7, and 8 are formed by the same methods used to form the corresponding regions of the structure shown in FIG. 2. Finally, photolithographic techniques in conjunction with either a wet chemical etch or a plasma etch are utilized to pattern regions 7 and 8 and to thereby form interconnect lines.

For some applications, utility of the capacitor structure can be improved by providing electrical connections to the upper surface of capacitor first electrodes. When the substrate is an insulator, application of a potential difference directly between capacitor first and second electrodes requires providing an opening through the capacitor dielectric. When the substrate is an insulator, resistance in series with capacitance can be reduced by providing electrical connections to capacitor first electrodes through openings in the capacitor dielectric. Finally, even when the substrate is a conductor, interconnections of capacitors with other devices may be more flexible and more efficient if contact to capacitor first electrodes is made directly through openings in the capacitor dielectric rather than indirectly by contacts to the substrate.

Figure 5:
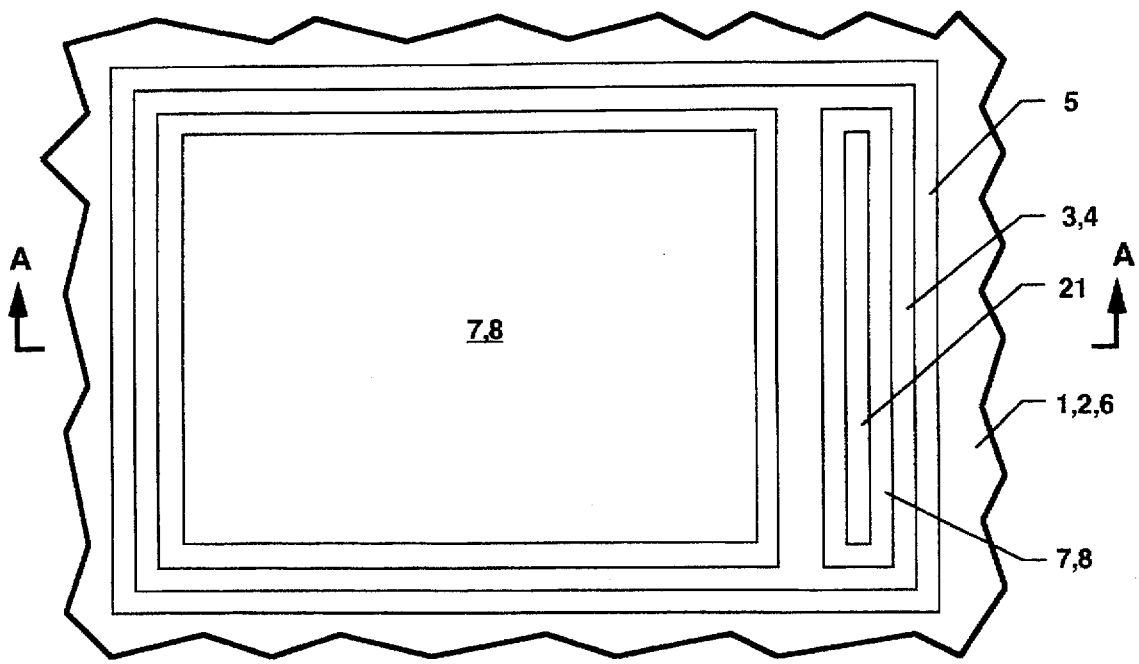
FIG. 5 is a top view illustration of a capacitor having an electrical contact to the first capacitor electrode provided at an opening through the capacitor dielectric.
Figure 6:
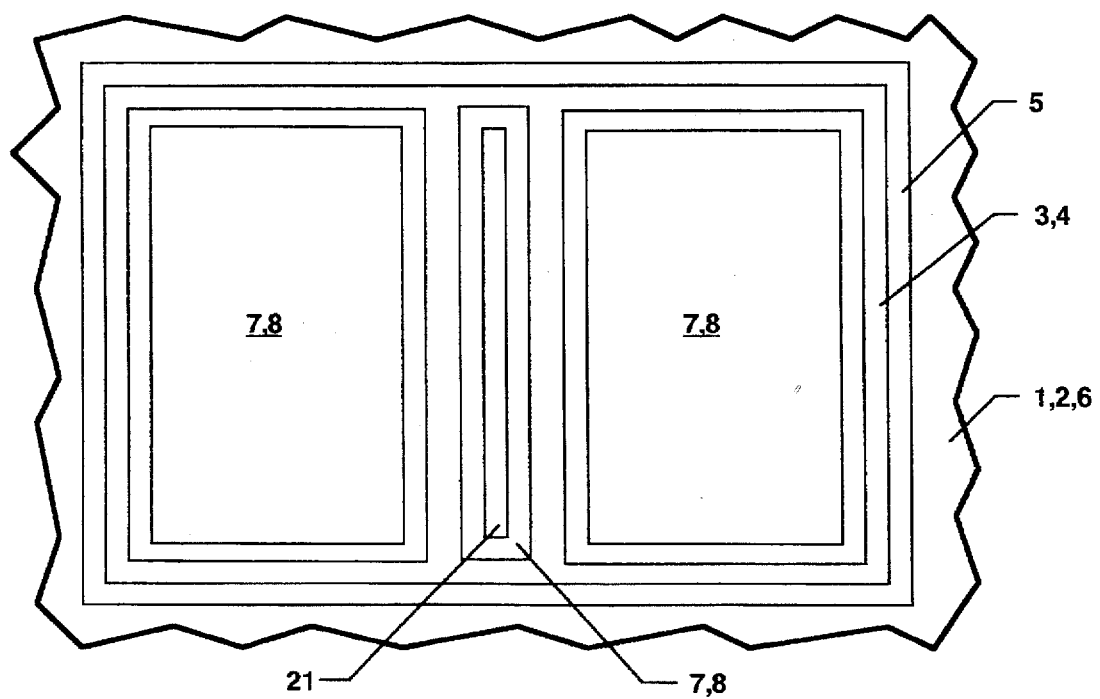
FIG. 6 is a top view illustration of two capacitors that share a common first electrode with contact to the first electrode provided at an opening through the capacitor dielectric.

Referring now to FIGS. 5 and 6, there are shown representative capacitor structures wherein a contact to the capacitor first electrode is provided at an opening 21 through the capacitor dielectric. Reference numerals other than 21 in FIGS. 5 and 6 designate regions already described in conjunction with FIGS. 1–4. In FIG. 5, contact to the capacitor first electrode is shown on the right side of the structure. In FIG. 6, contact to a capacitor first electrode is made between two second electrode features. In FIG. 5, the labels A—A denote the plane for a representative cross section view.

Material structure along the plane labeled A—A in FIG. 5 is depicted in FIG. 7. The numbers 1–8 designate regions already described in conjunction with FIGS. 1–4. Region 21 is the opening provided through capacitor dielectric region 5. As illustrated, direct electrical contact between conductive region 8 and the capacitor first electrode, region 4, can be made at the opening 21. If required by the application, some or all of the material regions 9–13 that are shown in FIG. 3 can be added to the structure shown in FIG. 7. Because etching of transition-metal oxides is difficult, providing openings through the capacitor dielectric by masking oxidation is preferable to etching openings through the capacitor dielectric subsequent to its growth.

Figure 8:
FIG. 8 is an illustration of a structural feature that inhibits oxidation of that portion of the first capacitor electrode which underlies the structural feature.
Figure 9:
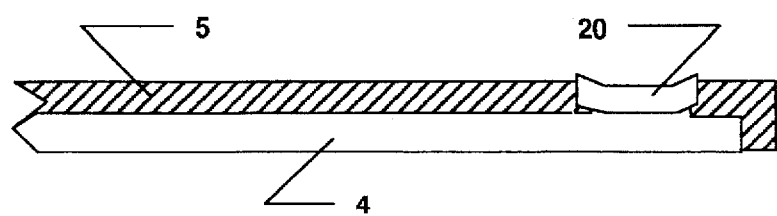
FIG. 9 is an illustration of a structure for providing an opening through the capacitor dielectric without employing an etch to form the opening.

A preferred means for providing openings through the capacitor dielectric is illustrated in FIGS. 8 and 9. After depositing and patterning a transition-metal nitride to form the capacitor first electrode region 4, a masking feature region 20 is formed where contact is to be provided to the first electrode. Region 20 comprises a material, such as polycrystalline silicon or silicon nitride, that masks oxidation and that can be deposited over the transition-metal nitride and then patterned by photolithographic and etching processes without causing excessive damage to the transition-metal nitride region. After defining masking features at sites where first electrode direct contacts are to be provided, the capacitor dielectric region 5 is grown over the exposed surface of the first electrode region 4. During growth of capacitor dielectric region 5, the oxidant is inhibited in diffusing to the surface of the first electrode where the first electrode is protected by the masking feature 20, either because the oxidant reacts with the masking feature material as in the case of polycrystalline silicon or because diffusion of the oxidant through the masking material is very slow as in the case of silicon nitride. After growth of the capacitor dielectric, masking feature region 20 is removed by a wet chemical or plasma etch that is selective to the underlying transition-metal nitride. An opening 21 is thus provided through capacitor dielectric region 5 after removal of the masking feature.

If required by the application, regions 9–13 shown in FIG. 3 can be formed by well known methods. A dielectric region comprising a polyimide or benzocyclobutene can be formed by a heat treatment that follows application of a suitable precursor material. A dielectric material comprising silicon dioxide, silicon oxynitride or silicon nitride can be deposited by sputtering, but CVD is the preferred deposition method. Conductive region 11 may be deposited either by sputtering or by CVD. If optional region 13 is included and it comprises a conductive epoxy compound, region 13 may be deposited by screen printing or by using a dispensing machine to apply small dots of epoxy. If optional region 13 is included and it comprises a solder alloy, region 13 may be formed by depositing solder-paste dots using screen printing or a dispensing machine followed by a heat treatment that causes solder bumps to form as a result of surface tension. Finally, patterning of regions 9–12 can be accomplished using well known photolithographic and etch methods.

The method employed to grow the transition-metal oxide region 5 on the surface of the transition-metal region 4 must provide a transition-metal oxide layer that has: a predictable and stable dielectric permittivity, a predictable thickness, a low density of defects within the layer, and a low density of defects at the interface between the layer and region 4. Predictable and stable dielectric permittivity is achieved by growing the transition-metal oxide on the surface of the transition-metal nitride at a temperature in the range of 400–700 degrees C. Predictable thickness and low defect densities are achieved by an appropriate choice of growth atmosphere. Defect densities may also be reduced by annealing in an inert atmosphere following growth of the transition-metal oxide layer.

The preferred atmospheres for growth of transition-metal oxide region 4 are a mixture of argon or helium and an oxidant. Because nitrogen released at the interface between regions 4 and 5 during the growth of region 5 must escape by diffusing to the surface of region 5, nitrogen should not be a component of the growth atmosphere. The oxidant can be selected from among oxygen, water vapor or an organic compound, such as isopropyl or isobutyl alcohol that releases reactive oxygen during pyrolysis. Nitrogen accumulation would cause structural defects within region 5 and at the interface between regions 4 and 5 if nitrogen pressure were to reach a sufficient level. To prevent nitrogen accumulation near the interface between regions 4 and 5 and to allow control of region 5 thickness by timed exposure to the growth atmosphere, the rate at which the oxidant reacts with the transition-metal nitride must be sufficiently slow. Setting partial pressure of the oxidant to a value in the range of 0.1–100 torr is a preferred means for controlling the rate at which the oxidant reacts with the transition-metal nitride. In summary, the preferred growth atmosphere is an oxidant diluted by argon or helium to achieve an oxidant partial pressure in the range of 0.1–100 torr.

During deposition of a metal nitride or a metal by CVD methods, a volatile compound of the metal is an essential component of the reactor atmosphere. The volatile compound may be selected from among certain metal halides and certain organometallic compounds. Preferred selections for volatile compounds of titanium include titanium tetrachloride, tetraisopropyltitanate, and tetrakisdimethylamino titanium. Preferred selections for volatile compounds of aluminum include aluminum trichloride and dimethylaluminum hydride. Preferred volatile compounds of copper include copper beta-dikatonates and cyclopentadienyl-copper.

Referring again to FIG. 4, whether capacitor structures are formed using CVD or sputter deposition, many variations in structure and method are within the scope of the present invention. As one example, titanium nitride region 81 can be eliminated and a region 82 comprising doped polycrystalline silicon, aluminum or an aluminum alloy can be utilized to form capacitor second electrodes. But, elimination of region 81 requires that properties of the interface between region 82 and capacitor dielectric region 5 be acceptable. As a second example, in the process of making electrical contacts between conductive region 8 and capacitor second electrodes, an opening may be etched through region 82 as shown in FIG. 4, or the electrical contact may be made between regions 8 and 82 in the case that region 82 is a conductor such as doped polycrystalline silicon or a metal. As a third example, another transition metal can be substituted for titanium. As a fourth example, the titanium silicide layer 2 may be eliminated if a heavily-doped silicon wafer is used for the substrate.

I claim:

1. A process for forming a capacitor and interconnect line structure, the process comprising:

providing a substrate upon which material regions are to be formed;

providing a first conductive region comprising nitrogen compounded with a transition metal, said first conductive region being (a) unpatterned and overlying all of said substrate or (b) patterned to provide one or more features overlying said substrate, said first conductive region forming capacitor first electrodes;

providing a first dielectric region comprising oxygen compounded with said transition metal, said first dielectric region being formed over a surface of said first conductive region by reaction of an oxidant with said compound of nitrogen and a transition metal comprising said first conductive region, said reaction comprising the steps of:

(a) establishing an atmosphere comprising argon or helium;

(b) increasing a temperature of said substrate and said overlying first conductive region to a temperature within the range of 400 to 700 degrees C.;

(c) adding an oxidant to said atmosphere while holding a partial pressure of said oxidant at a value in the range of 0.1 to 100 torr;

(d) removing said oxidant from said atmosphere when said first dielectric region has grown to a layer thickness in the range of 10 to 500 nanometers; and (e) annealing in said atmosphere for a time interval in the range of 10 seconds to 10 minutes;

providing a second dielectric region overlying said first dielectric region and directly overlying said substrate where neither said first conductive region nor said first dielectric region is interposed between said second dielectric region and said substrate;

providing one or more openings in said second dielectric region to provide access to an upper surface of said first dielectric region;

providing a selected number of additional openings in said second dielectric region to provide access to said substrate at sites where said second dielectric region directly overlies said substrate; and providing a second conductive region overlying said first dielectric region at selected openings in said second dielectric region, said second conductive region overlying said substrate at selected other openings in said second dielectric region, said second conductive region further overlying a portion of said second dielectric region, said second conductive region forming capacitor second electrodes, said second conductive region also forming interconnections between said capacitor second electrodes and external devices, forming interconnections between said substrate and an external circuit power supply or a circuit ground, and forming interconnections between various external devices.

2. A process as in claim 1, further comprising the step of providing a first material bonding region sandwiched between said first conductive region and said substrate.

3. A process as in claim 2, further comprising the step of providing a second material bonding region sandwiched between said second conductive region and said second dielectric region, said second material bonding region being sandwiched between said second conductive region and said first dielectric region at selected openings in said second dielectric region, and said second material bonding region being sandwiched between said second conductive region and said substrate at other selected openings in said second dielectric region.

4. A process as in claim 1, wherein said first conductive region is formed by steps selected from a group consisting of (a) reacting nitrogen or ammonia with a volatile compound of titanium; (b) sputtering from a titanium target using a mixture of argon and nitrogen ions; (c) sputtering from a tantalum target using a mixture of argon and nitrogen ions; and (d) sputtering from a hafnium target using a mixture of argon and nitrogen ions.

5. A process as in claim 1, wherein said second conductive region is formed by steps selected from a group consisting of (a) reacting nitrogen or ammonia with a volatile compound of titanium; (b) pyrolysis of a volatile compound of aluminum; (c) pyrolysis of volatile compounds of aluminum, titanium, and silicon; and (d) pyrolysis of a volatile compound of copper.

6. A process as in claim 1 wherein said second conductive region is formed by the steps of:

sputtering from a titanium target using a mixture of argon and nitrogen ions to form a titanium nitride layer;

sputtering from a titanium target using argon ions to form a first titanium layer overlying said titanium nitride layer;

sputtering from a target comprising aluminum or an aluminum alloy to form an aluminum or an aluminum alloy layer overlying said titanium layer;

sputtering from a titanium target using argon ions to form a second titanium layer overlying said aluminum or aluminum alloy layer;

sputtering from a titanium target using a mixture of argon, nitrogen, and oxygen ions, an oxygen ion flux on said titanium target being less than ten percent of a nitrogen ion flux on said titanium target to thereby form a titanium oxynitride layer overlying said second titanium layer; and annealing the sputtered layers comprising said second conductive region at a temperature in the range of 400 to 500 degrees C. to react said first titanium layer with said underlying titanium nitride layer and said overlying aluminum or aluminum alloy layer and to react said second titanium layer with said underlying aluminum or aluminum alloy layer and said overlying titanium oxynitride layer.

7. A process as in claim 1, further comprising the steps of:

providing a third dielectric region overlying said second dielectric region and said second conductive region;

providing openings in said third dielectric region to provide access to said second conductive region;

providing additional openings in said third dielectric region that are concentric with said additional openings in said second dielectric region to provide access to an upper surface of said substrate at sites where said second dielectric region directly overlies said substrate;

providing a third conductive region overlying said second conductive region at selected openings in said third dielectric region, said third conductive region overlying said substrate at selected ones of said additional openings in said third dielectric region that are concentric with said additional openings in said second dielectric region, said third conductive region overlying a portion of said third dielectric region;

providing a fourth dielectric region overlying said third dielectric region and said third conductive region;

providing openings in said fourth dielectric region to provide access to an upper surface of said third conductive region;

providing additional openings in said fourth dielectric region that are concentric with additional openings in said third dielectric region to provide access to an upper surface of said second conductive region.

8. A process as in claim 7 further comprising the step of providing a third material bonding region sandwiched between said third conductive region and said third dielectric region, said third material bonding region being sandwiched between said third conductive region and said second conductive region at said openings in said third dielectric region, said third material bonding region being sandwiched between said third conductive region and said substrate at selected ones of said additional openings in said third dielectric region that are concentric with said additional openings in said second dielectric region.

9. A process as in claim 7, further comprising the step of providing a fourth conductive region overlying a portion of said fourth dielectric region, said fourth conductive region overlying said third conductive region at selected openings in said fourth dielectric region, said fourth conductive region overlying said second conductive region at said additional openings in said fourth dielectric region that are concentric with additional openings in said third dielectric region, said fourth conductive region forming bumps for electrically connecting said structure to external devices.

10. A process for forming a capacitor and interconnect line structure, the process comprising:

providing a substrate upon which material regions are to be formed;

providing a first conductive region comprising nitrogen compounded with a transition metal, said first conductive region being patterned to provide one or more capacitor first electrodes that overlying a portion of said substrate;

providing a first dielectric region comprising oxygen compounded with said transition metal, said first dielectric region overlying upper and side surfaces of said capacitor first electrodes and being formed by reaction of an oxidant with said compound of nitrogen and a transition metal comprising said first conductive region, said reaction comprising the steps of:
 (a) establishing an atmosphere comprising argon or helium;
 (b) increasing a temperature of said substrate and said overlying first conductive region to a temperature within the range of 400 to 700 degrees C.;
 (c) adding an oxidant to said atmosphere while holding a partial pressure of said oxidant at a value in the range of 0.1 torr to 100 torr;
 (d) removing said oxidant from said atmosphere when said first dielectric region has grown to a layer thickness in the range of 10 to 500 nanometers; and
 (e) annealing in said atmosphere for a time interval in the range of 10 seconds to 10 minutes;

providing a second dielectric region overlying said substrate and said first dielectric region;

providing one or more openings in said second dielectric region to provide access to said first dielectric region where said first dielectric region overlies said one or more capacitor first electrodes;

providing openings in said second dielectric region that are concentric with openings provided in said first dielectric region to provide access to each of the one or more capacitor first electrodes;

providing a selected number of additional openings in said second dielectric region, as required by an application of said structure, at sites where said second dielectric region directly overlies said substrate;

providing a second conductive region overlying said first dielectric region at selected openings in said second dielectric region, said second conductive region overlying said substrate at selected other openings in said second dielectric region, said second conductive region further overlying a portion of said second dielectric region, said second conductive region further overlying said first conductive region at selected openings in said second dielectric region that are concentric with openings in said first dielectric region.

11. A process as in claim 10, further comprising the step of providing a first material bonding region sandwiched between said first conductive region and said substrate.

12. A process as in claim 11, further comprising the step of providing a second material bonding region sandwiched between said second conductive region and second dielectric region, said second material bonding region being sandwiched between said second conductive region and said first dielectric region at selected openings in said second dielectric region, said second material bonding region being sandwiched between said second conductive region and said substrate at selected other openings in said second dielectric region, and said second material bonding region being sandwiched between said first and second conductive regions at selected other openings in said first and second dielectric regions that are concentric.

13. A process as in claim 10, further comprising the steps of:
 providing a third dielectric region overlying said second dielectric region and said second conductive region;
 providing openings in said third dielectric region to provide access to said second conductive region;
 providing additional openings in said third dielectric region that are concentric with said additional openings in said second dielectric region to provide access to an upper surface of said substrate;
 providing a third conductive region overlying said second conductive region at selected openings in said third dielectric region, said third conductive region overlying said substrate at selected concentric openings in said second and third dielectric regions, said third conductive region overlying a portion of said third dielectric region;
 providing a fourth dielectric region overlying said third dielectric region and said third conductive region;
 providing openings in said fourth dielectric region to provide access to an upper surface of said third conductive region; and
 providing additional openings in said fourth dielectric region that are concentric with openings in said third dielectric region to provide access to an upper surface of said second conductive region.

14. A process as in claim 13, further comprising the step of providing a third material bonding region sandwiched between said third conductive region and said third dielectric region, said third material bonding region being sandwiched between said third conductive region and said second conductive region at selected openings in said third dielectric region, and said third material bonding region being sandwiched between said third conductive region and said substrate at selected other openings in said second and third dielectric regions that are concentric.

15. A process as in claim 14, further comprising the step of providing a fourth conductive region overlying a portion of said fourth dielectric region, said fourth conductive region overlying said third conductive region at selected openings in said fourth dielectric region, said fourth dielectric region overlying said second conductive region at selected openings in said third and fourth dielectric regions that are concentric, said fourth conductive region forming bumps for electrically connecting said structure to external devices.

16. A process as in claim 1, wherein said step of providing a substrate comprises:
 providing a dielectric layer that overlies an integrated circuit; and
 providing openings in said dielectric layer through which electrical connection is made between said structure and terminals of devices within said integrated circuit.

17. A process as in claim 10, wherein said step of providing a substrate comprises:
 providing a dielectric layer that overlies an integrated circuit; and
 providing openings in said dielectric layer through which electrical connection is made between said structure and terminals of devices within said integrated circuit.

18. A process for forming a capacitor and interconnect line structure, the process comprising:
 providing a substrate comprising a titanium silicide layer at a surface of a silicon wafer, said silicon wafer being doped with a dopant selected from a group consisting of boron, arsenic, antimony, phosphorus, and a combination of arsenic and phosphorus, said titanium silicide layer having a thickness in the range of 100 to 500 nanometers;
 providing a first conductive region overlying said substrate and forming capacitor first electrodes, said first conductive region comprising nitrogen compounded with titanium;
 providing a first dielectric region overlying said first conductive region, said first dielectric region comprising oxygen compounded with titanium, said first dielectric region being formed by reaction of an oxidant with said compound of nitrogen and titanium that comprises said first conductive region, said reaction comprising the steps of:
(a) establishing an atmosphere comprising argon or helium;
(b) increasing a temperature of said substrate and said overlying first conductive region to a temperature within the range of 400 to 700 degrees C.;
(c) adding an oxidant to said atmosphere while holding a partial pressure of said oxidant at a value in the range of 0.1 to 100 torr;
(d) removing said oxidant from said atmosphere when said first dielectric region has grown to a layer thickness in the range of 10 to 500 nanometers; and
(e) annealing in said atmosphere for a time interval in the range of 10 seconds to 10 minutes;

providing a second conductive region overlying said first dielectric region, said second conductive region being patterned to form capacitor second electrode features;

providing a second dielectric region overlying said first dielectric region and said second conductive region;

providing openings in said second dielectric region to provide access to each of said capacitor second electrode features; and providing a third conductive region overlying said second dielectric region and said second conductive region at said openings in said second dielectric region, said third conductive region being patterned to form interconnect lines.

19. A process for forming a capacitor and interconnect line structure, the process comprising:

providing a substrate comprising a titanium silicide layer at a surface of a silicon wafer, said silicon wafer being doped with a selected one of boron, arsenic, antimony, phosphorus, and a combination of arsenic and phosphorus, said titanium silicide layer having a thickness in the range of 100 to 500 nanometers;

providing a first conductive region overlying said substrate to form capacitor first electrodes, said first conductive region comprising nitrogen compounded with titanium;

providing a first dielectric region comprising oxygen compounded with titanium, said first dielectric region being formed over a surface of said first conductive region by reaction of an oxidant with said compound of nitrogen and titanium that comprises said first conductive region, said reaction comprising the steps of:
(a) establishing an atmosphere comprising argon or helium;
(b) increasing a temperature of said substrate and said overlying first conductive region to a temperature within the range of 400 to 700 degrees C.;
(c) adding an oxidant to said atmosphere while holding a partial pressure of said oxidant at a value in the range of 0.1 to 100 torr;
(d) removing said oxidant from said atmosphere when said first dielectric region has grown to a layer thickness in the range of 10 to 500 nanometers; and
(e) annealing in said atmosphere for a time interval in the range of 10 seconds to 10 minutes;

providing a second conductive region overlying said first dielectric region, said second conductive region comprising a transition metal compounded with nitrogen;

providing a protective layer region, overlying said second conductive region, for inhibiting oxidation of said second conductive region;

providing one or more capacitor second electrode features formed by patterning said protective layer region and said second conductive region;

providing a second dielectric region overlying said first dielectric region and said protective layer region;

providing openings in said second dielectric region to provide access to each of said capacitor second electrode features; and providing a third conductive region overlying said second dielectric region and said capacitor second electrode features at said openings in said second dielectric region, said third conductive region being patterned to form interconnect lines.

20. A process as in claim 19, wherein:

said transition metal comprises titanium;

said protective layer region is formed by chemical vapor deposition of silicon nitride; and said openings in said second dielectric region extend through said protective layer region to provide access to said second conductive region within each of said capacitor second electrode features.

21. A process as in claim 19, wherein:

said transition metal comprises titanium;

said protective layer region comprises polycrystalline silicon doped with a selected one of boron, arsenic, phosphorus, and a combination of arsenic and phosphorus; and said openings in said second dielectric region terminate at said protective layer region.

22. A process as in claim 19, wherein:

said step of providing a protective layer region comprises chemical vapor deposition of silicon nitride;

said step of providing one or more capacitor second electrode features employs photolithography in conjunction with plasma etching to pattern said protective layer region, followed by employing the patterned protective layer region as a mask for etching said second conductive region, the step of etching said second conductive region employing a step selected from a group consisting of:
(a) a solution comprising water, ammonium hydroxide, and hydrogen peroxide;
(b) a solution comprising water, sulfuric acid, and hydrogen peroxide;
(c) a solution comprising water, hydrochloric acid, and hydrogen peroxide; and
(d) a plasma process employing a plasma containing chlorine ions.

23. A process as in claim 19, wherein:

said step of providing a protective layer region comprises chemical vapor deposition of silicon nitride;

said step of providing one or more capacitor second electrode features employs photolithography in conjunction with plasma etching to pattern said protective layer region, followed by exposing said structure to an oxidizing atmosphere to convert a portion of said second conductive region not covered by said protective layer region to oxygen compound with said transition metal.

* * * * *